United States Patent
Jing

(10) Patent No.: US 10,332,885 B1
(45) Date of Patent: Jun. 25, 2019

(54) SYSTEMS AND METHODS FOR PROVIDING CAPACITOR STRUCTURES IN AN INTEGRATED CIRCUIT

(71) Applicant: Xilinx, Inc., San Jose, CA (US)

(72) Inventor: Jing Jing, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/987,722

(22) Filed: May 23, 2018

(51) Int. Cl.
  *H01L 23/522* (2006.01)
  *H01L 27/108* (2006.01)
  *H01L 29/76* (2006.01)
  *G11C 11/24* (2006.01)
  *H01L 27/10* (2006.01)
  *H01L 27/105* (2006.01)
  *H01L 49/02* (2006.01)
  *H01L 27/02* (2006.01)
  *G06F 17/50* (2006.01)

(52) U.S. Cl.
  CPC ........ *H01L 27/101* (2013.01); *H01L 23/5222* (2013.01); *H01L 27/0207* (2013.01); *H01L 27/1052* (2013.01); *H01L 28/60* (2013.01); *G06F 17/5036* (2013.01)

(58) Field of Classification Search
  CPC ... H01L 23/5222; H01L 28/60; H01L 27/101; H01L 27/0207; H01L 27/1052; G06F 17/5036
  USPC ....... 257/532, 534, 528, 516, 306, 307, 309, 257/E27.048, E27.07, E21.008, E21.012, 257/E29.343; 333/174; 361/301.4, 361/306.2, 306.3, 303, 313, 328, 329; 438/50, 255, 957
  See application file for complete search history.

(56) References Cited

U.S. PATENT DOCUMENTS

| | | | | |
|---|---|---|---|---|
| 7,485,914 B2* | 2/2009 | Huang | ............... | H01L 23/5223 257/307 |
| 7,944,732 B2* | 5/2011 | de Jong | ............. | H01L 23/5223 257/208 |
| 9,331,013 B2* | 5/2016 | Yen | ..................... | H01L 23/5223 |
| 9,524,964 B2 | 12/2016 | Jing et al. | | |
| 2008/0079117 A1* | 4/2008 | Baumgartner | ...... | H01L 23/5223 257/532 |
| 2010/0127351 A1* | 5/2010 | Quinn | ................ | H01L 23/5223 257/534 |

(Continued)

OTHER PUBLICATIONS

U.S. Appl. No. 15/707,552, filed Sep. 18, 2017, Jing et al., San Jose, CA USA.

*Primary Examiner* — Dao H Nguyen
(74) *Attorney, Agent, or Firm* — David O'Brien

(57) ABSTRACT

A capacitor includes a cell array including a plurality of cells and a fine tuning cell electrically coupled to the cell array by a first bus and a second bus. Each cell of the cell array includes a first number of fingers electrically coupled to the first and second bus, and a second number of fingers electrically coupled to the first and second bus. The fine tuning cell includes a third number of fingers electrically coupled to the first and second bus, and a fourth number of fingers electrically coupled to the first and second bus. The directional alignment of the first and second number of fingers is generally perpendicular, the directional alignment of the third and fourth number of fingers is generally perpendicular, and the second number of fingers is different than the fourth number of fingers.

20 Claims, 10 Drawing Sheets

(56) References Cited

U.S. PATENT DOCUMENTS

| | | | | |
|---|---|---|---|---|
| 2012/0212877 A1* | 8/2012 | Lu | ............................ | H01G 5/011 |
| | | | | 361/301.4 |
| 2012/0257324 A1* | 10/2012 | Ma | .......................... | C04B 35/491 |
| | | | | 361/301.4 |
| 2014/0367827 A1* | 12/2014 | Lee | ...................... | H01L 23/5223 |
| | | | | 257/532 |
| 2015/0145615 A1* | 5/2015 | Jing | ..................... | H01L 23/5227 |
| | | | | 333/174 |

* cited by examiner

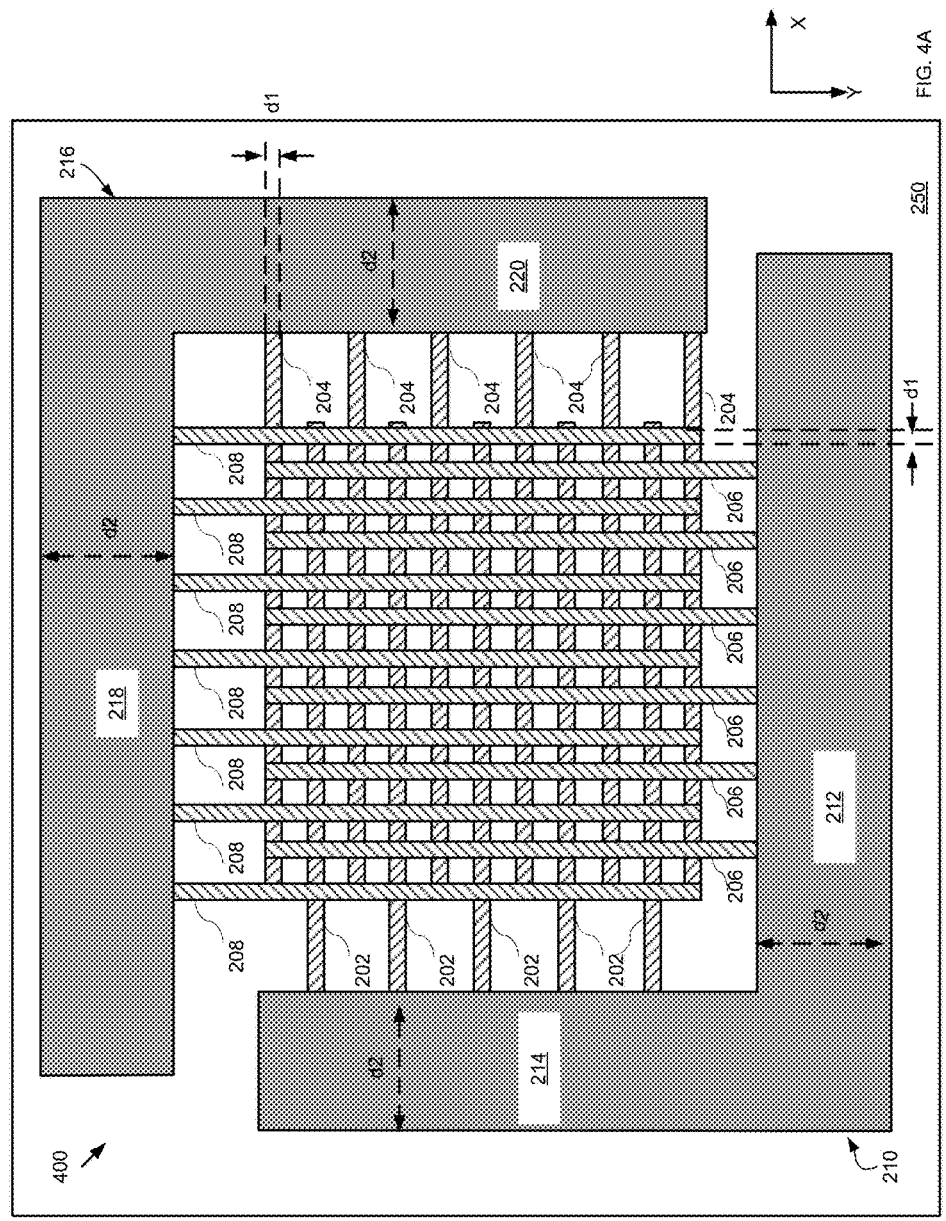

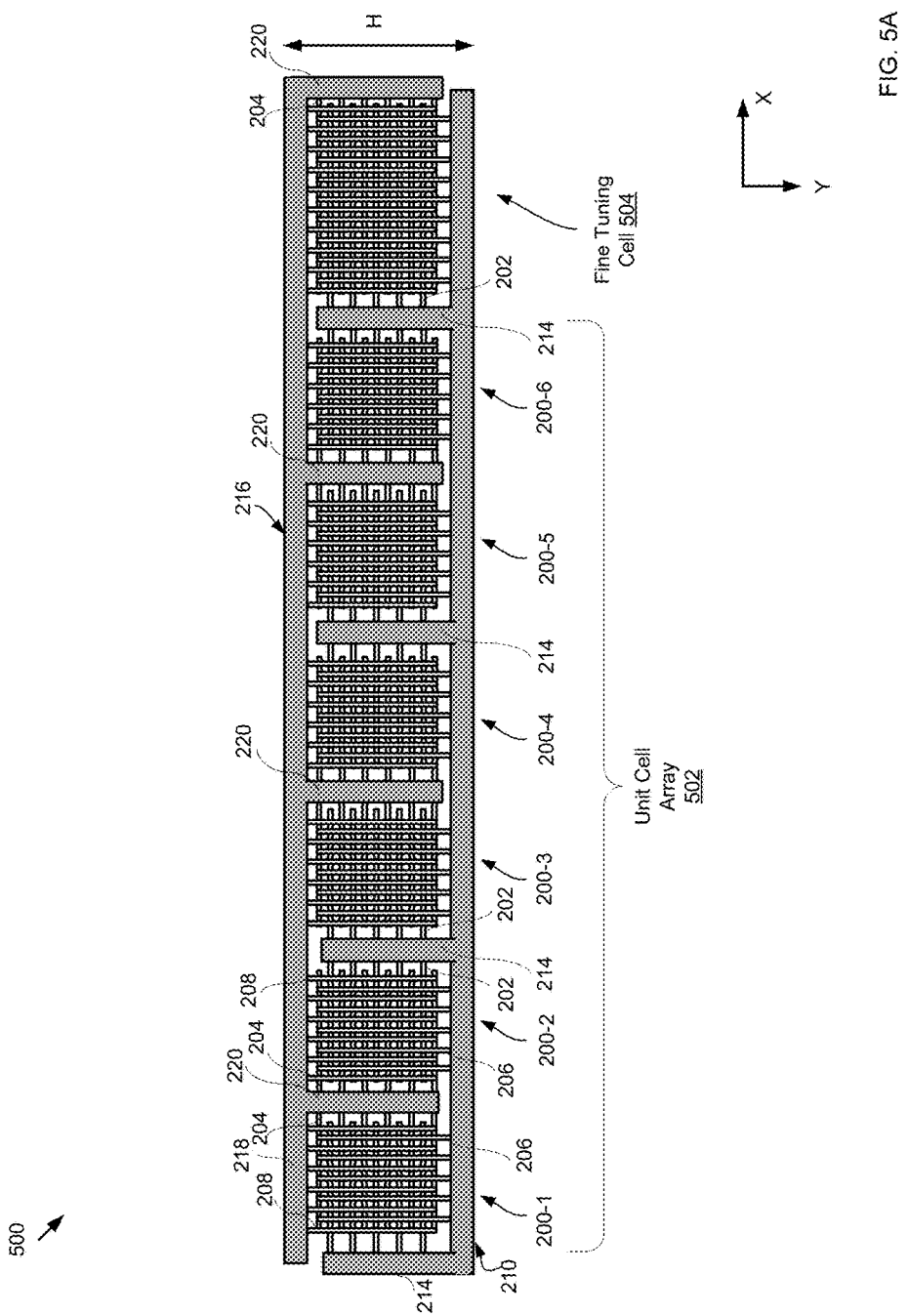

800

Provide (design and optionally fabricate) a fingercap array including a unit cell array and a fine tuning cell, wherein the unit cell array includes a fixed number of vertical fingers (nv) and a fixed number of horizontal fingers (nh), and wherein the fine tuning cell includes the fixed number of vertical fingers (nv) and a different number of horizontal fingers (nh)
802

Define a first parameter (ncol) that identifies a total number of cells in the fingercap array and a second parameter (nh) that identifies a number of horizontal fingers in the fine tuning cell
804

Compute a total capacitance and a total resistance of the fingercap array based at least partly on the first and second parameters, wherein the total capacitance is computed by treating the unit cell array and the fine tuning cell as being in parallel, and wherein the total resistance is computed by treating the unit cell array and the fine tuning cell as being in series
806

FIG. 8

SYSTEMS AND METHODS FOR PROVIDING CAPACITOR STRUCTURES IN AN INTEGRATED CIRCUIT

FIELD

Examples of the present disclosure generally relate to integrated circuits (ICs) and, in particular, to an embodiment related to systems and methods for providing capacitor structures in integrated circuits.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor design, manufacturing processes, and technology.

At least one existing challenge relates to the design and implementation of finger capacitors ("fingercaps"), which may be used as part of a variety of IC devices such as voltage controlled oscillators (VCOs), analog-to-digital converters (ADCs), or other IC devices. In some cases, fingercaps may be employed as part of an LC tank or resonator circuit. Finger capacitor designs are critical for achieving high LC tank performance, and at least some advanced IC devices (e.g., VCOs) may be designed to operate at a specific target capacitance. With the continued scaling down of IC dimensions, it has been challenging to maintain high fingercap performance and quality factor (Q), while also providing the desired target capacitance and preserving chip area.

Accordingly, there is a need for improved systems and methods for providing capacitor structures in integrated circuits.

SUMMARY

In some embodiments in accordance with the present disclosure, a capacitor includes a cell array including a plurality of cells, and a fine tuning cell electrically coupled to the cell array by a first bus and a second bus. In some examples, each cell of the cell array includes a first number of directionally-aligned fingers electrically coupled to a respective one of the first and second bus, and a second number of directionally-aligned fingers electrically coupled to a respective one of the first and second bus. In some embodiments, the fine tuning cell includes a third number of directionally-aligned fingers electrically coupled to a respective one of the first and second bus, and a fourth number of directionally-aligned fingers electrically coupled to a respective one of the first and second bus. In some cases, the directional alignment of the first and second number of directionally-aligned fingers is generally perpendicular, and the directional alignment of the third and fourth number of directionally-aligned fingers is generally perpendicular. In some embodiments, the second number of fingers is different than the fourth number of fingers.

In some embodiments, the cell array and the fine tuning cell are aligned in a first row along a first direction.

In some embodiments, the first number of fingers and the third number of fingers are arrayed in a second direction generally perpendicular to the first direction, and the second number of fingers and the fourth number of fingers are arrayed in the first direction.

In some embodiments, the first number of fingers, the second number of fingers, the third number of fingers, and the fourth number of fingers each include a respective pair of interdigitated finger sets, where a first set of the interdigitated finger set pair is electrically coupled to the first bus, and where a corresponding second set of the interdigitated finger set pair is electrically coupled to the second bus.

In some embodiments, the first number of fingers is the same as the third number of fingers.

In some embodiments, the first bus and the second bus each include portions extending in the second direction, where the portions extending in the second direction interpose each cell of the cell array, and where the portions extending in the second direction interpose the cell array and the fine tuning cell.

In some embodiments, the portions extending in the second direction electrically couple to the first, second, third, or fourth number of fingers.

In some embodiments, each cell of the cell array has a first lateral dimension along a Y-direction, and the fine tuning cell has a second lateral dimension along the Y-direction equal to the first lateral dimension.

In some embodiments, the capacitor has a total capacitance equal to a sum of capacitances of each of the cells of the cell array and the fine tuning cell.

In some embodiments, the capacitor further includes a second row having another cell array and another fine tuning cell aligned in the second row along the first direction. In some examples, the another fine tuning cell includes a fifth number of directionally-aligned fingers and a sixth number of directionally-aligned fingers generally perpendicular to the fifth number of directionally-aligned fingers, where the sixth number of fingers is different than the fourth number of fingers.

In some embodiments in accordance with the present disclosure, an integrated circuit includes a first on-chip capacitor device, where the integrated circuit further includes a first cell array and a first fine tuning cell aligned in a first row along an X-direction. In some example, the first fine tuning cell is disposed at a first end of the first cell array, and cells of the first cell array and the first fine tuning cell are electrically coupled to each other by a first bus and a second bus. In some embodiments, the integrated circuit further includes a second cell array and a second fine tuning cell aligned in a second row along the X-direction, the second row adjacent to the first row, where the second fine tuning cell is disposed at a second end of the second cell array, and where cells of the second cell array and the second fine tuning cell are electrically coupled to each other by a third bus and a fourth bus. In some cases, the first fine tuning cell includes a first number of fingers extending in a Y-direction and arrayed in the X-direction, where the first number of fingers are electrically coupled to a respective one of the first and second bus. In some embodiments, the second fine tuning cell includes a second number of fingers extending in the Y-direction and arrayed in the X-direction, where the second number of fingers are electrically coupled to a respective one of the third and fourth bus. In various examples, the first number of fingers is different than the second number of fingers.

In some embodiments, the integrated circuit further includes a programmable logic device (PLD) including the first on-chip capacitor device, where the first on-chip capacitor device provides one of plural tuned capacitances selectable on the PLD.

In some embodiments, cells of the first cell array each include a third number of fingers extending in the Y-direction and arrayed in the X-direction, where the third number of fingers are electrically coupled to a respective one of the first and second bus, cells of the second cell array each include a fourth number of fingers extending in the Y-direction and arrayed in the X-direction, where the fourth number of fingers are electrically coupled to a respective one of the third and fourth bus, the third number of fingers is different than the first number of fingers, and the fourth number of fingers is different than the second number of fingers.

In some embodiments, cells of the first cell array each include a third number of fingers extending in the X-direction and arrayed in the Y-direction, where the third number of fingers are electrically coupled to a respective one of the first and second bus, and cells of the second cell array each include a fourth number of fingers extending in the X-direction and arrayed in the Y-direction, where the fourth number of fingers are electrically coupled to a respective one of the third and fourth bus.

In some embodiments, the first fine tuning cell includes a fifth number of fingers extending in the X-direction and arrayed in the Y-direction, where the fifth number of fingers are electrically coupled to a respective one of the first and second bus, the second fine tuning cell includes a sixth number of fingers extending in the X-direction and arrayed in the Y-direction, where the sixth number of fingers are electrically coupled to a respective one of the third and fourth bus.

In some embodiments, the third number of fingers is the same as the fifth number of fingers, and the fourth number of fingers is the same as the sixth number of fingers.

In some embodiments, each cell of the first cell array has a first lateral dimension along the Y-direction, where the first fine tuning cell has a second lateral dimension along the Y-direction equal to the first lateral dimension, where each cell of the second cell array has a third lateral dimension along the Y-direction, where the second fine tuning cell has a fourth lateral dimension along the Y-direction equal to the third lateral dimension.

In some embodiments, the first fine tuning cell has a first cell width, and the second fine tuning cell has a second cell width different than the first cell width.

In some embodiments in accordance with the present disclosure, a method includes providing a fingercap array including a cell array and a fine tuning cell, where cells of the cell array include a fixed number of vertical fingers and a fixed number of horizontal fingers, and where the fine tuning cell includes the fixed number of vertical fingers and a different number of horizontal fingers. In some embodiments, the method further includes defining a first parameter that identifies a total number of cells in the fingercap array and a second parameter that identifies the different number of horizontal fingers, and computationally determining, based in part on the first parameter and the second parameter, a total capacitance and a total resistance of the fingercap array, where the total capacitance is computationally determined by treating the cell array and the fine tuning cell as being in parallel, and where the total resistance is computationally determined by treating the cell array and the fine tuning cell as being in series.

In some embodiments, the different number of horizontal fingers is determined based on both a total number of horizontal fingers in the fingercap array and on a number of horizontal fingers in each cell of the cell array.

Other aspects and features will be evident from reading the following detailed description and accompanying drawings.

BRIEF DESCRIPTION OF THE DRAWINGS

FIG. 4A is a block diagram illustrating a top view of a semiconductor device including a fine tuning cell, according to some embodiments of the present disclosure.

FIG. 5A is a block diagram illustrating a top view of a semiconductor device including a fingercap array and a fine tuning cell, according to some embodiments of the present disclosure.

FIG. 8 is a flow diagram illustrating a method to model a fingercap array including a fine tuning cell, according to some embodiments of the present disclosure.

DETAILED DESCRIPTION

Figure 1:
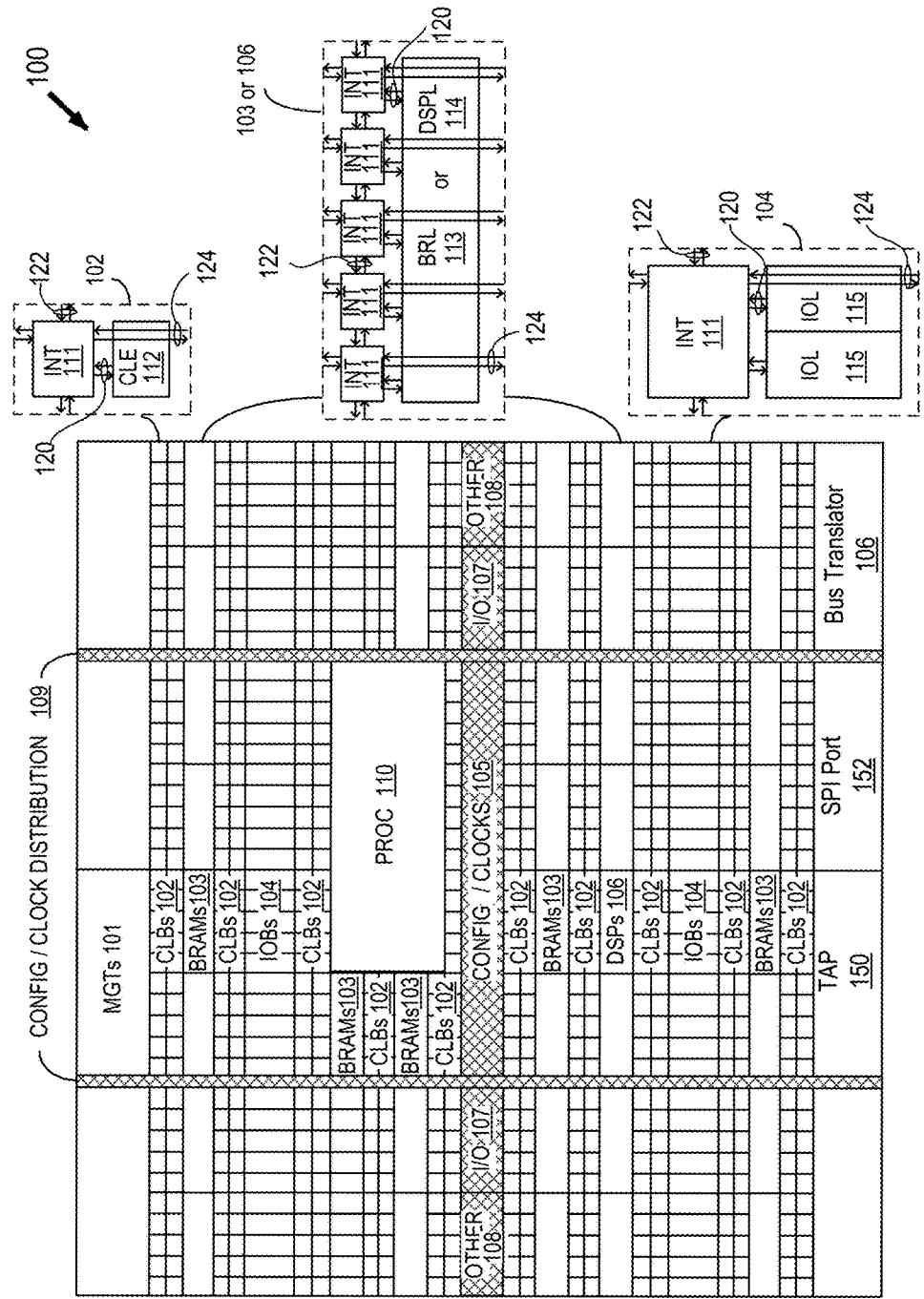
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, the design and implementation of finger capacitors ("fingercaps"), used in VCOs, ADCs, or other IC devices, remains a challenge. In some cases, fingercaps may be employed as part of an LC tank or resonator circuit. Finger capacitor designs are critical for achieving high LC tank performance, and at least some advanced IC devices (e.g., VCOs) may be designed to operate at a specific target capacitance. With the continued scaling down of IC dimensions, it has been challenging to maintain high fingercap performance and quality factor (Q), while also providing the desired target capacitance and preserving chip area. In at least some existing techniques, fingercaps have been designed using repeating unit cells in rows and/or columns to form a fingercap array, where the constituent unit cells are connected to each other using buses that are wider than a fingercap finger width. Generally, for a fingercap array, the total capacitance is substantially equal to the sum of the capacitances of each of the unit cells in the fingercap array. Stated another way, the minimum capacitance resolution of the fingercap array is limited by the unit cell capacitance. However, in at least some examples, the unit cell capacitance is not small enough to provide for fine tuning of the fingercap array capacitance. Fingercap array capacitance fine tuning is highly desirable to provide a specified target capacitance, as called for in the design of advanced IC devices. In some cases, fine tuning of the unit cell capacitance may be provided by modifying the unit cell by reducing the number of fingers in the unit cell. However, such an approach cannot provide a small enough resolution for the unit cell capacitance at least because a minimum number of fingers are needed to maintain process control. In addition, reducing the number of fingers in a unit cell would mean that more unit cells would have to be used to meet the specified target capacitance. Further, the addition of more unit cells would also increase the chip area and compromise the quality factor of the fingercap array. For integrated circuit (IC) solutions, it has been discovered that using a separate fine tuning cell, for example as part of the fingercap array, can provide the desired fine tuning capability while having a negligible impact on fingercap chip area and quality factor.

With the above general understanding borne in mind, various embodiments for providing a capacitor are generally described below. Various advantages may be present in various applications of the present disclosure. No particular advantage is required for all embodiments, and different embodiments may offer different advantages. For example, embodiments discussed herein include methods and systems for providing fingercap arrays having a desired target capacitance, without the drawbacks of at least some current solutions, as noted above. In some embodiments, a fine tuning cell is placed at an end of a unit cell array (e.g., as the first or last cell), where the fine tuning cell is connected to the unit cell array by the buses, as discussed above. By way of example, the fine tuning cell may be placed at the end of the unit cell array in order to simplify layout grouping and SPICE modeling. However, in some cases, the fine tuning cell may be located elsewhere, such as between adjacent cells of the unit cell array. In various embodiments, the fine tuning cell may have a similar number of capacitor fingers as a unit cell of the fingercap array along a first direction (e.g., a vertical direction), and the fine tuning cell may have a different number of capacitor fingers as the unit cell of the fingercap array along a second direction (e.g., a horizontal direction). By maintaining the same number of fingers, along the vertical direction, between the fine tuning cell and the unit cell, the height of the fine tuning cell will be the same as the height of the unit cell. For purposes of this disclosure, the height of the unit cell array and the fine tuning cell is a lateral dimension measured along a Y-axis parallel to a substrate surface, with the unit cell array and the fine tuning cell aligned along an X-axis parallel to the substrate and perpendicular to the Y-axis. The number of fingers for the fine tuning cell, along the second direction, may range from the number of fingers of a single unit cell up to the number of fingers of two unit cells, with the number of fingers for the fine tuning cell being increased in pairs (e.g., increased by two capacitor fingers at a time). Thus, the fine tuning cell provides for selection of target capacitances that are between an integer number of unit cells. In various examples, a single fine tuning cell may be used to provide the fine tuning capability for a given fingercap array. By placing a single fine tuning cell at an end of a fingercap array, and by modifying the number of fingers in one direction (e.g., the horizontal direction) while keeping the number of fingers in the other direction (e.g., the vertical direction) fixed, the total chip area for the fingercap array and the quality factor are minimally affected. For instance, since the fine tuning cell is the only cell of the fingercap array to have a different size, the chip area and quality factor are substantially dominated by the majority of the fingercap array, which is of a uniform size (e.g., size of the unit cell).

Separately, and in addition, embodiments of the present disclosure provide a method to accurately model (e.g., using SPICE) a fingercap array including a fine tuning cell. For example, various methods provide for the use of parameters that identify: (i) a total number of cells in a given fingercap array, and (ii) the number of fingers for the fine tuning cell along the second direction. By providing these parameters, embodiments disclosed herein provide for accurate calculation of the resistance and capacitance of the fingercap array. Additional embodiments and advantages are discussed below and/or will be evident to those skilled in the art in possession of this disclosure.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, for each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown).

The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may incorporate the semiconductor devices including the fingercap array and fine tuning cell is not limited to the exemplary IC depicted in FIG. 1, and that ICs having other configurations, or other types of ICs, may also include the fingercap array and fine tuning cell.

Figure 2:
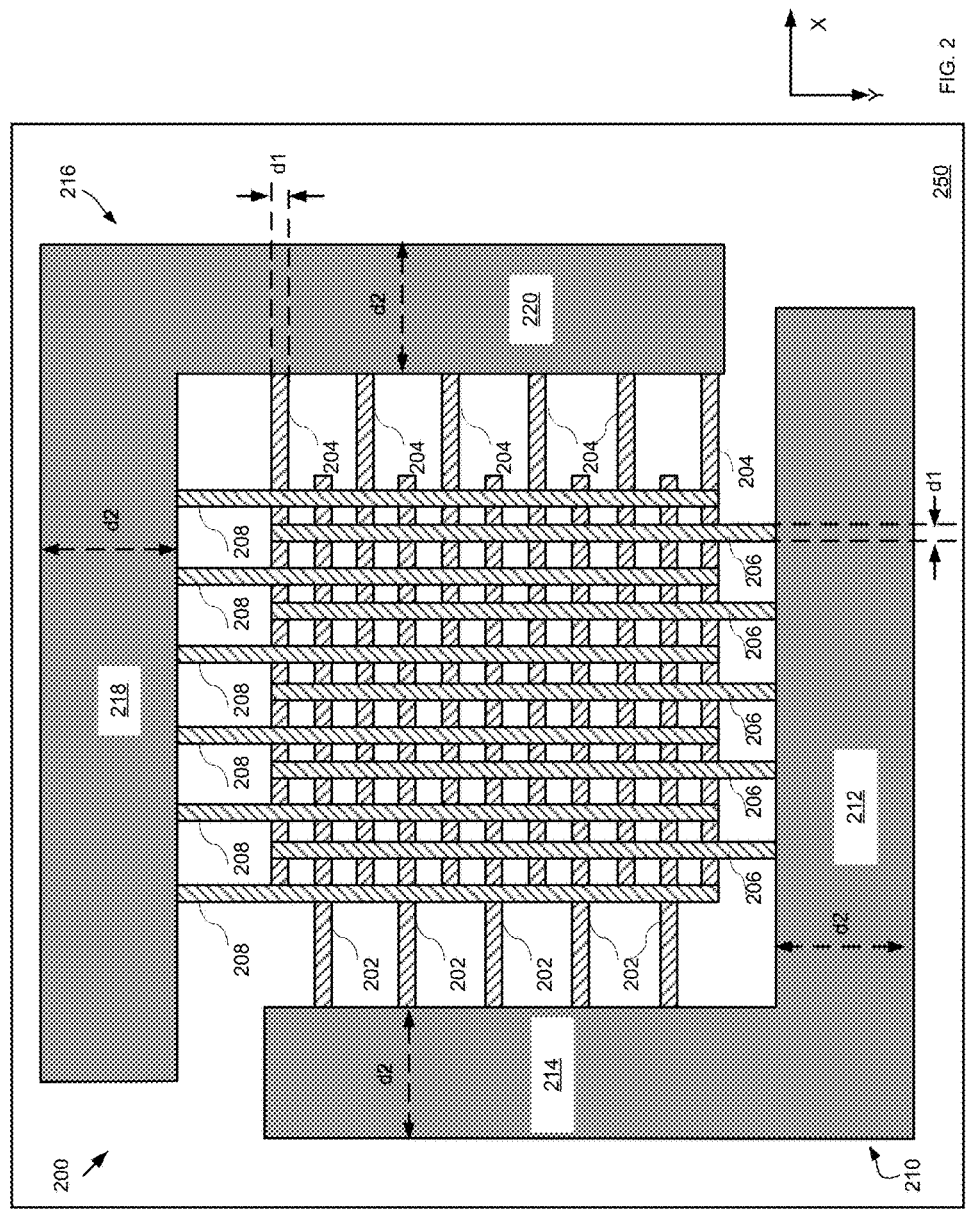
FIG. 2 is a block diagram illustrating a top view of a semiconductor device, according to some embodiments of the present disclosure.
Figure 3:
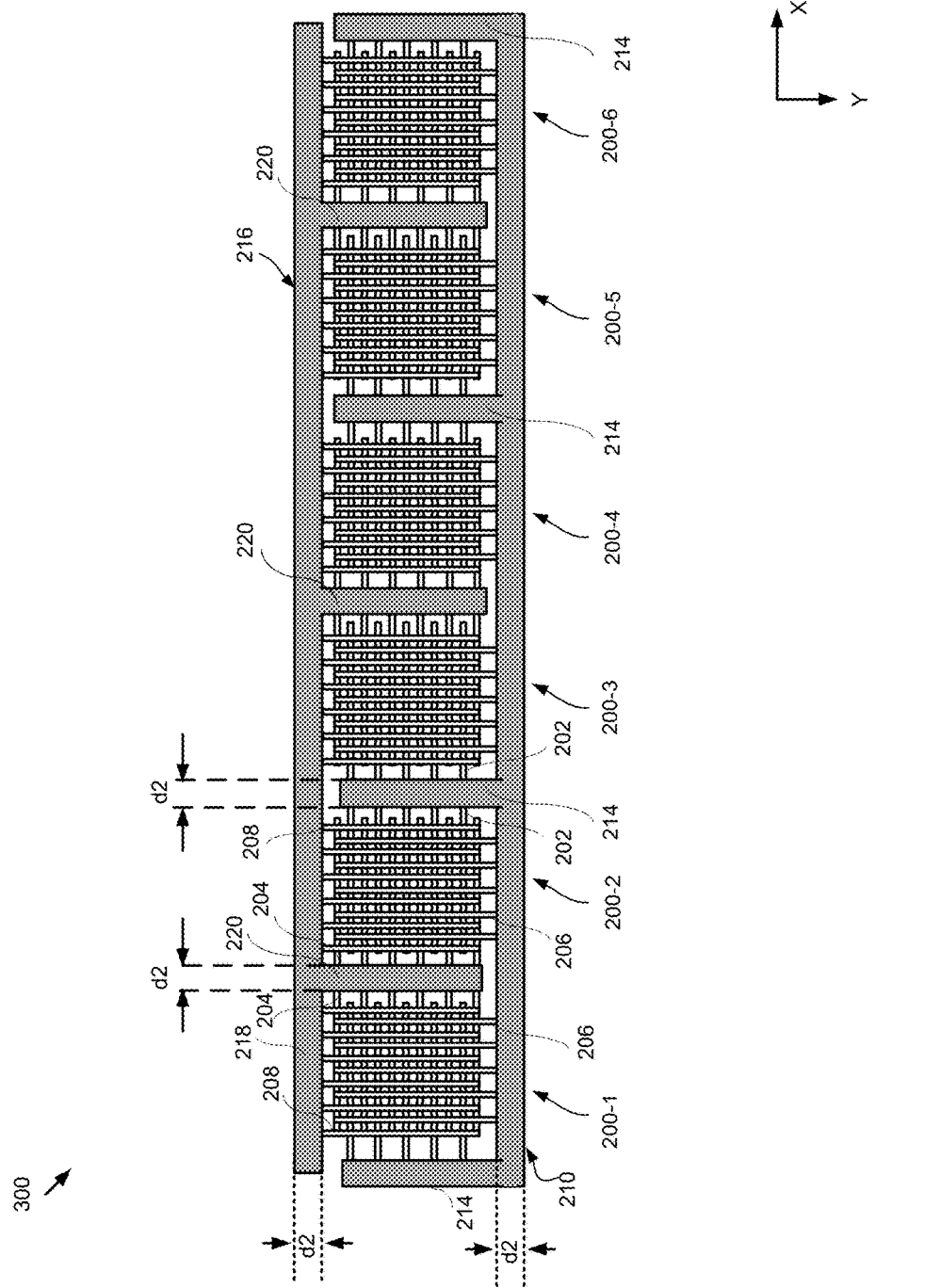
FIG. 3 is a block diagram illustrating a top view of a semiconductor device including a fingercap array, according to some embodiments of the present disclosure.

For purposes of the discussion that follows, reference is now made to the example of FIGS. 2 and 3, which show a cell 200 and a fingercap array 300, respectively. In some embodiments, the cell 200 may include a unit cell, as described above, and the fingercap array 300 may include a fingercap array designed and fabricated according to at least some existing techniques, and which does not include a fine tuning cell. In various examples, the cell 200 and the fingercap array 300 may be formed within a semiconductor device 250 (e.g., such as the FPGA of FIG. 1). The semiconductor device may be formed on a silicon substrate and may include various doping configurations depending on design requirements. In addition, the substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features. The semiconductor device 250 may further include various devices formed in or on the substrate such as active components including Field Effect Transistors (FETs), Bipolar Junction Transistors (BJTs), and diodes, passive components including resistors, capacitors, and transformers, or other suitable devices.

In various examples, the semiconductor device 250 may include an interconnect structure including a plurality of metal layers M1, M2, M3, M4, M5, M6, M7, M8, and M9 formed over the substrate. The metal layers M1-M9 may include metal lines formed of conductive materials such as aluminum, copper, aluminum-silicon-copper alloys, titanium, titanium nitride, tantalum, tantalum nitride, tungsten, polysilicon, other suitable conductive materials, or combinations thereof. In some embodiments, the interconnect structure may further include inter-metal dielectric (IMD) layers to electrically isolate the metal layers M1-M9 from each other. By way of example, the IMD layers may include different dielectric materials such as low-k dielectric materials, silicon nitride, silicon oxynitride, spin-on glass (SOG), undoped silicate glass (USG), fluorinated silica glass (FSG), carbon doped silicon oxide (e.g., SiCOH), carbon-containing material, polyimide, other porous polymeric materials other suitable dielectric materials, and/or combinations thereof. In some embodiments, the IMD layers include metal vias connecting metal lines in different metal layers (e.g., metal layers M1-M9).

As shown in the example of FIG. 2, the semiconductor device 250 includes the cell 200. In some embodiments, fingers 202 and 204 (which may be formed within metal layers M4, M6, and M8) extend in an X direction (e.g., the horizontal direction) according to a unidirectional restriction of the corresponding metal layers (e.g., M4, M6, and M8), while the fingers 202, 204 are arrayed in a Y direction (e.g., the vertical direction). For purposes of this discussion, a number of fingers 202, 204 arrayed in the vertical direction may be referred to as a number of vertical fingers (nv). As shown, the fingers 202, 204 are interdigitated with each other. In some embodiments, fingers 206 and 208 (which may be formed within metal layers M5, M7, and M9) extend in the Y direction (e.g., the vertical direction) according to a unidirectional restriction of the corresponding metal layers (e.g., M5, M7, and M9), while the fingers 206, 208 are arrayed in the X direction (e.g., the horizontal direction). For purposes of this discussion, a number of fingers 206, 208 arrayed in the horizontal direction may be referred to as a number of horizontal fingers (nh). As shown, the fingers 206, 208 are interdigitated with each other.

As also illustrated in FIG. 2, the cell 200 includes a bus 210 including a portion 212 extending in the X direction and a portion 214 extending in the Y direction. The cell 200 further includes a bus 216 including a portion 218 extending in the X direction and a portion 220 extending in the Y direction. Each of the buses 210 and 216 include metal lines formed in the metal layers M4-M9, with vias within interposing IMD layers which connect the metal lines. In some embodiments, fingers 202 are connected to the bus 210 through the portion 214, and fingers 204 are connected to the bus 216 through the portion 220. Thus, a first number of the interdigitated fingers 202, 204 (the fingers 202) are electrically coupled to the bus 210, and a second number of the interdigitated fingers 202, 204 (the fingers 204) are electrically coupled to the bus 216. In some examples, fingers 206 are connected to the bus 210 through the portion 212, and fingers 208 are connected to the bus 216 through the portion 218. Thus, a first number of the interdigitated fingers 206, 208 (the fingers 206) are electrically coupled to the bus 210, and a second number of the interdigitated fingers 206, 208 (the fingers 208) are electrically coupled to the bus 216.

In the example of FIG. 2, the portions 212, 214 of the bus 210 and the portions 218, 220 of the bus 216 have the same width d2. However, in other examples, various portions of the buses 210 and 216 may have different widths. In addition, in the illustrated example, the cell 200 includes five fingers 202 and six fingers 204, and the cell 200 includes five fingers 206 and six fingers 208. Thus, in the present example, the number of vertical fingers (nv) is equal to eleven, and the number of horizontal fingers (nh) is also equal to eleven. However, in various embodiments, the cell 200 may include any number of fingers 202, 204, 206, and 208. To be sure, while different numbers of fingers may in general be used, the unit cell described herein (e.g., with reference to FIG. 2) may have an equal number of vertical fingers (nv) and horizontal fingers (nh). Further, in the illustrated example, each of the fingers 202, 204, 206, and 208 has a width d1 that is substantially the same as the minimum metal pitch size. In some embodiments, spacing between adjacent fingers (e.g., between adjacent fingers 206 and 208, or between adjacent fingers 202 and 204) is also substantially the same as the minimum metal pitch size. In some examples, the minimum metal pitch size is about 38 nm. However, in other embodiments, the fingers 202, 204, 206, and 208 may have different widths. In the particular example of FIG. 2, each of the fingers 202, 204, 206, and 208 have a length-to-width ratio that is less than 20:1. However, in other embodiments, fingers having larger length-to-width ratios fingers may be used.

Referring to FIG. 3, in some embodiments, the fingercap array 300 may be formed by aligning the cells 200 (of FIG. 2) in a row along the X direction or a column along the Y direction. By repeating the cells 200 to form the fingercap array 300 with a high capacitance, current may be forced to pass largely through the buses 210, 216 which are wider than and have a much smaller parasitic resistance than the fingers.

By way of example, the fingercap array 300 is formed by aligning cells 200-1, 200-2, 200-3, 200-4, 200-5, and 200-6 in a row in the X direction. Portions of the buses 210 and 216 extending in the Y direction interpose adjacent cells. For example, a portion 214 of the bus 210 interposes cells 200-2 and 200-3, and another portion 214 of the bus 210 interposes cells 200-4 and 200-5. As a further example, a portion 220 of the bus 216 interposes cells 200-1 and 200-2, another portion 220 of the bus 216 interposes cells 200-3 and 200-4, and another portion 220 of the bus 216 interposes cells 200-5 and 200-6.

In some embodiments, each of the portions of the buses 210 and 216 extending in the Y direction that interpose adjacent cells may connect to fingers of the adjacent cells. For example, each of the fingers 204 of the cell 200-1 connect to a portion 220 of the bus 216 by physically contacting a left sidewall of the portion 220, and fingers 204 of the cell 200-2 connect to the portion 220 by physically contacting a right sidewall of the portion 220. As a further example, fingers 202 of the cell 200-2 connect to a portion 214 of the bus 210 by physically contacting a left sidewall of the portion 214. Similarly, fingers 202 of the cell 200-3 connect to the portion 214 by physically contacting a right sidewall of the portion 214.

In the example of FIG. 3, the portions 214 and 220 of the buses 210 and 216, which connect to fingers of adjacent cells, may have a width d2 in the X direction. In some examples, when forming the fingercap array 300 by repeating the cell 200 of FIG. 2 in a row, the portions 214 and 220 of adjacent cells may substantially overlap with each other. As such, each of the portions 214 and 220 interposing adjacent cells has a width d2 that is the same as the width d2 of portions 214 and 220 of the cell 200 of FIG. 2. By overlapping the portions of the buses of adjacent cells, finger capacity density is increased, which reduces the total chip area of the fingercap array 300.

As shown in the example of FIG. 3, the fingercap array 300 includes a single row having six cells aligned in the X direction. In other embodiments, the row of the fingercap array 300 may include any number of cells aligned in the X direction. Alternatively, in some embodiments, the fingercap array 300 may include a column including any number of cells in the Y direction.

In some examples, the total capacitance of the fingercap array 300 is substantially equal to the sum of the capacitances of each of the cells 200-1, 200-2, 200-3, 200-4, 200-5, and 200-6. As such, the minimum capacitance resolution of the fingercap array 300 is limited by the capacitance of an individual repeated cell 200, having an equal number of vertical fingers (nv) and horizontal fingers (nh). However, as discussed above, this cell capacitance (e.g., unit cell capacitance) is not small enough to provide for fine tuning of the capacitance of the fingercap array 300. Capacitance fine tuning is highly desirable to provide a specified target capacitance, in particular for advanced IC devices.

As previously noted, it has been discovered that using a separate fine tuning cell as part of the fingercap array (e.g., the fingercap array 300) can provide the desired fine tuning capability while having a negligible impact on fingercap chip area and quality factor. With reference to FIGS. 4A, 4B, 5, 6, 7, and 8 systems and methods for providing a fingercap array including a fine tuning cell are described. In some embodiments, one or more aspects discussed above with reference to the cell 200 (FIG. 2) and the fingercap array 300 (FIG. 3) may also apply to the systems and methods for providing the fingercap array including the fine tuning cell, discussed below. Thus, some aspects of the various embodiments of the fingercap array including the fine tuning cell may only be discussed briefly for purposes of clarity in understanding.

Figure 4B:
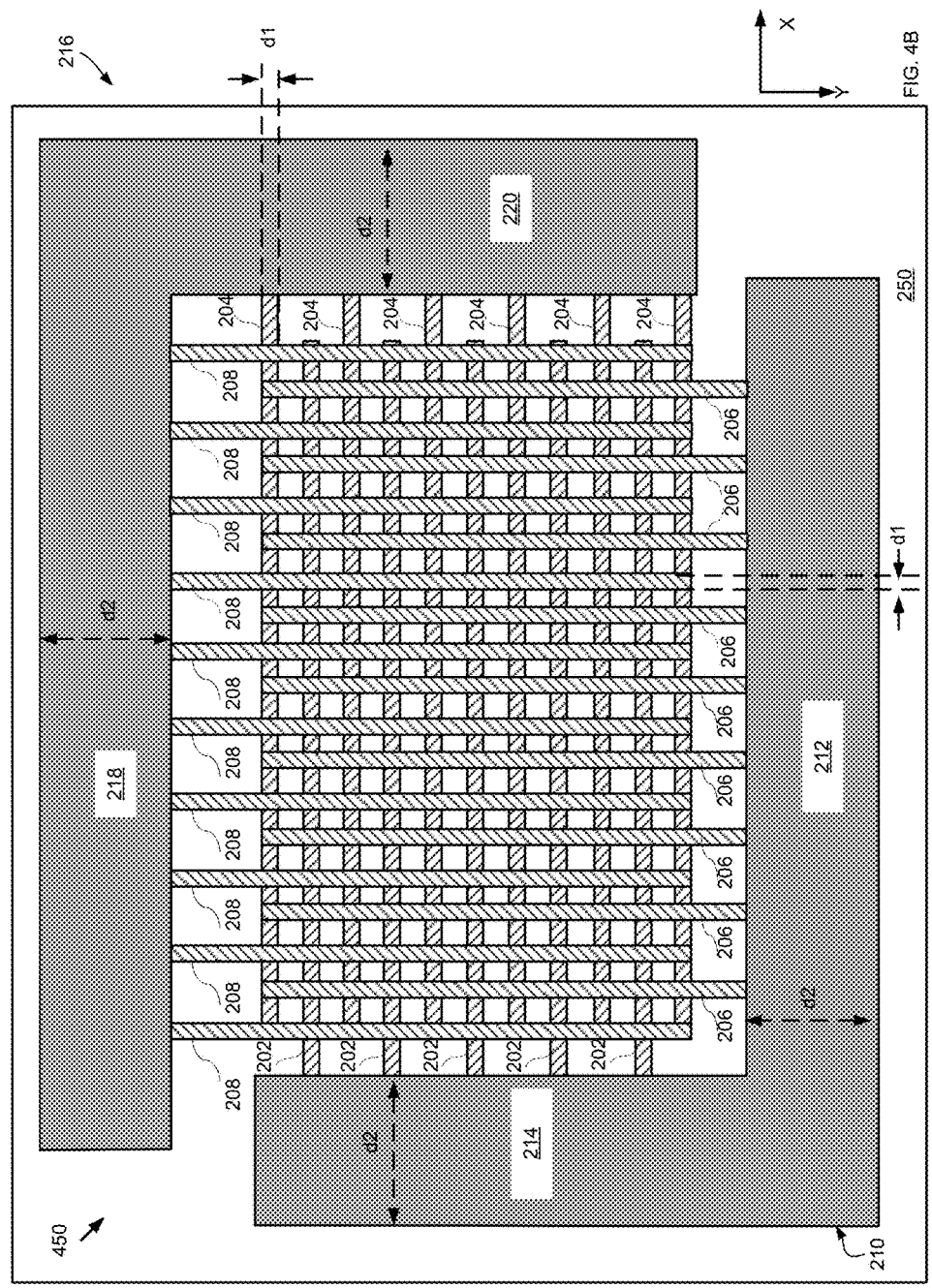
FIG. 4B is a block diagram illustrating a top view of a semiconductor device including an alternative fine tuning cell, according to some embodiments of the present disclosure.

Referring now to FIGS. 4A and 4B, illustrated therein are embodiments of a fine tuning cell 400 and a fine tuning cell 450. In various examples, the fine tuning cells 400, 450 may be formed within the semiconductor device 250 (e.g., such as the FPGA of FIG. 1), in a manner substantially the same as the cell 200 (FIG. 2). As shown in FIGS. 4A and 4B, the fine tuning cells 400, 450 include the fingers 202, 204, 206, 208, the bus 210 including the portions 212 and 214, and the bus 216 including the portions 218 and 220. In some embodiments, the fingers 202, 204, 206, 208 are connected to each of the bus 210 and the bus 216 through the portions 212, 214, 218, and 220, in substantially the same manner as described above with respect to FIG. 2. In addition, in some embodiments, the width and spacing of the fingers 202, 204, 206, 208 of the fine tuning cells 400, 450 is substantially the same as described above with reference to FIG. 2. However, as opposed to the unit cell 200 described above (FIG. 2) that has an equal number of vertical fingers (nv) and horizontal fingers (nh), the fine tuning cells 400, 450 may have the same number of vertical fingers (nv) as the unit cell 200 while also having a different number of horizontal fingers (nh) as the unit cell 200. In various embodiments, the number of vertical fingers (nv) for the fine tuning cells 400, 450 and the unit cell 200 are kept the same in order to maintain the same cell height between the fine tuning cells 400, 450 and the unit cell 200. FIG. 5A illustrates a measurement of the height 'H' of the unit cell array and the fine tuning cell, where the height is a lateral dimension measured along a Y-axis parallel to a substrate surface, with the unit cell array 502 and the fine tuning cell 504 aligned along an X-axis parallel to the substrate and perpendicular to the Y-axis. Returning to FIGS. 4A and 4B, and in at least one embodiment, the fine tuning cells 400, 450 have eleven vertical fingers (nv=11), similar to the unit cell 200. Additionally, in the examples of FIGS. 4A and 4B, the fine tuning cell 400 has thirteen horizontal fingers (nh=13), and the fine tuning cell 450 has nineteen horizontal fingers (nh=19). Depending on a desired target capacitance, and in some embodiments, the number of horizontal fingers (nh) for the fine tuning cells may range from the number of fingers of a single unit cell (nh=11) up to the number of fingers of approximately two unit cells (nh=21). In some cases, the number of fingers for the fine tuning cell are increased in pairs (e.g., increased by two fingers at a time). However, in some embodiments, the number of fingers for the fine tuning cell may instead be increased by any integer number of fingers. It is also noted that varying the number of fingers in just one direction (by varying nh), rather than varying the number of fingers in both directions (by varying nh and nv), provides for better tuning (e.g., increased resolution) of the capacitance by the fine tuning cell. In this manner, the fine tuning cell provides for selection of target capacitances that are between an integer number of unit cells. Moreover, a single fine tuning cell may be used to provide the desired fine tuning capability for a given fingercap array.

With reference to FIG. 5A, illustrated therein is a fingercap array 500 including a fine tuning cell. In particular, the fingercap array 500 includes a unit cell array 502 and a fine tuning cell 504. In the example of FIG. 5A, the fine tuning cell 504 is placed at an end of the fingercap array 500 as the last cell. However, in other embodiments, the fine tuning cell 504 may be placed at the other end of the fingercap array 500 as the first cell. In various examples, the fine tuning cell 504 is placed at an end of the fingercap array 500 in order to simplify layout grouping and SPICE modeling, as discussed in more detail below. To be sure, in some cases, the fine tuning cell 504 may be located elsewhere, such as between adjacent cells of the unit cell array 502.

Still referring to FIG. 5A, the unit cell array 502 may be formed by aligning the cells 200-1, 200-2, 200-3, 200-4, 200-5, and 200-6 in a row in the X direction (which may be the cell 200 of FIG. 2). As illustrated, the fine tuning cell 504 (which may be the fine tuning cell 400 of FIG. 4A or 450 of FIG. 4B) is similarly aligned with the cells of the unit cell array 502, and the fine tuning cell 504 is connected to the unit cell array 502 by the buses 210 and 216, as discussed above. Thus, in some embodiments, a portion 214 of the bus 210 interposes cell 200-6 of the unit cell array 502 and the fine tuning cell 504. In a similar manner as discussed above with respect to FIG. 3, each of the portions of the buses 210 and 216 extending in the Y direction (e.g., the portions 214 and 220) that interpose adjacent cells, including cells of the unit cell array 502 and the fine tuning cell 504, may connect to fingers of the adjacent cells. For example, each of the fingers 202 of the fine tuning cell 504 connect to a portion 214 of the bus 210 by physically contacting a right sidewall of the portion 214, and fingers 204 of the fine tuning cell connect to the portion 220 by physically contacting a left sidewall of the portion 220.

While the fine tuning cell 504 was described above as including the fine tuning cell 400 of FIG. 4A, which has thirteen horizontal fingers (nh=13), or the fine tuning cell 450 of FIG. 4B, which has nineteen horizontal fingers (nh=19), it will be understood that the fine tuning cell 504 may include different numbers of horizontal fingers (nh). For example, depending on a desired target capacitance of the fingercap array 500, the number of horizontal fingers (nh) for the fine tuning cell 504 may range from the number of fingers of a single unit cell (nh=11) up to the number of fingers of approximately two unit cells (nh=21). Thus, the fine tuning cell 504 provides coverage for the capacitance gap that previously existed between integer numbers of unit cells. In addition, while the fine tuning cell 504 may have different numbers of horizontal fingers (nh), the fine tuning cell 504 maintains the same number of vertical fingers (nv) as cells of the unit cell array 502.

As shown in the example of FIG. 5A, the fingercap array 500 includes a single row having six unit cells and one fine tuning cell aligned in the X direction. In other embodiments, the fingercap array 500 may include the unit cell array 502 having any number of cells, and one fine tuning cell disposed at an end of the unit cell array 502, aligned in the X direction. Alternatively, in some embodiments, the fingercap array 500 may include a columnar array including the unit cell array 502 having any number of cells, and one fine tuning cell disposed at an end of the unit cell array 502, aligned in the Y direction. Generally, a total number of cells (cells_tot) of the fingercap array 500 may be computed as the sum of cells of the unit cell array 502 (e.g., six cells) and the fine tuning cell 504 (e.g., one cell). As such, in the example of FIG. 5A, cell_tot=7. In addition, the total number of horizontal fingers (nh_tot) in the fingercap array may be calculated as (cells_tot−1)*unit_cell_nh+1*fine_tuning_cell_nh. Referring to the example of FIG. 5A, and assuming the fine tuning cell 504 is the fine tuning cell 450 of FIG. 4B having nh=19, nh_tot=(7−1)*11+1*19=85 horizontal fingers. As another example, consider that the fingercap array 500 includes 8 cells in the unit cell array 502 and one fine tuning cell 504, making cells_tot=9. In that example, and assuming the fine tuning cell 504 is the fine tuning cell 450 of FIG. 4B having nh=19, nh_tot=(9−1)*11+1*19=107 horizontal fingers.

In various examples, the total capacitance of the fingercap array 500 is substantially equal to the sum of the capacitances of each of the cells 200-1, 200-2, 200-3, 200-4, 200-5, 200-6 of the unit cell array 502 and the capacitance of the fine tuning cell 504. Rather than having the minimum capacitance resolution of the fingercap array 500 limited by the capacitance of an individual repeated cell of the unit cell array 502, the addition of the fine tuning cell 504 to the fingercap array 500 provides an increased fine tuning capability. In some embodiments, the capacitance resolution of the fingercap array 500 may be as small as one finger pair (e.g., of the fine tuning cell 504). As such, the fingercap array 500 may provide a desired target capacitance, while having a negligible impact on fingercap chip area and quality factor.

Figure 5B:
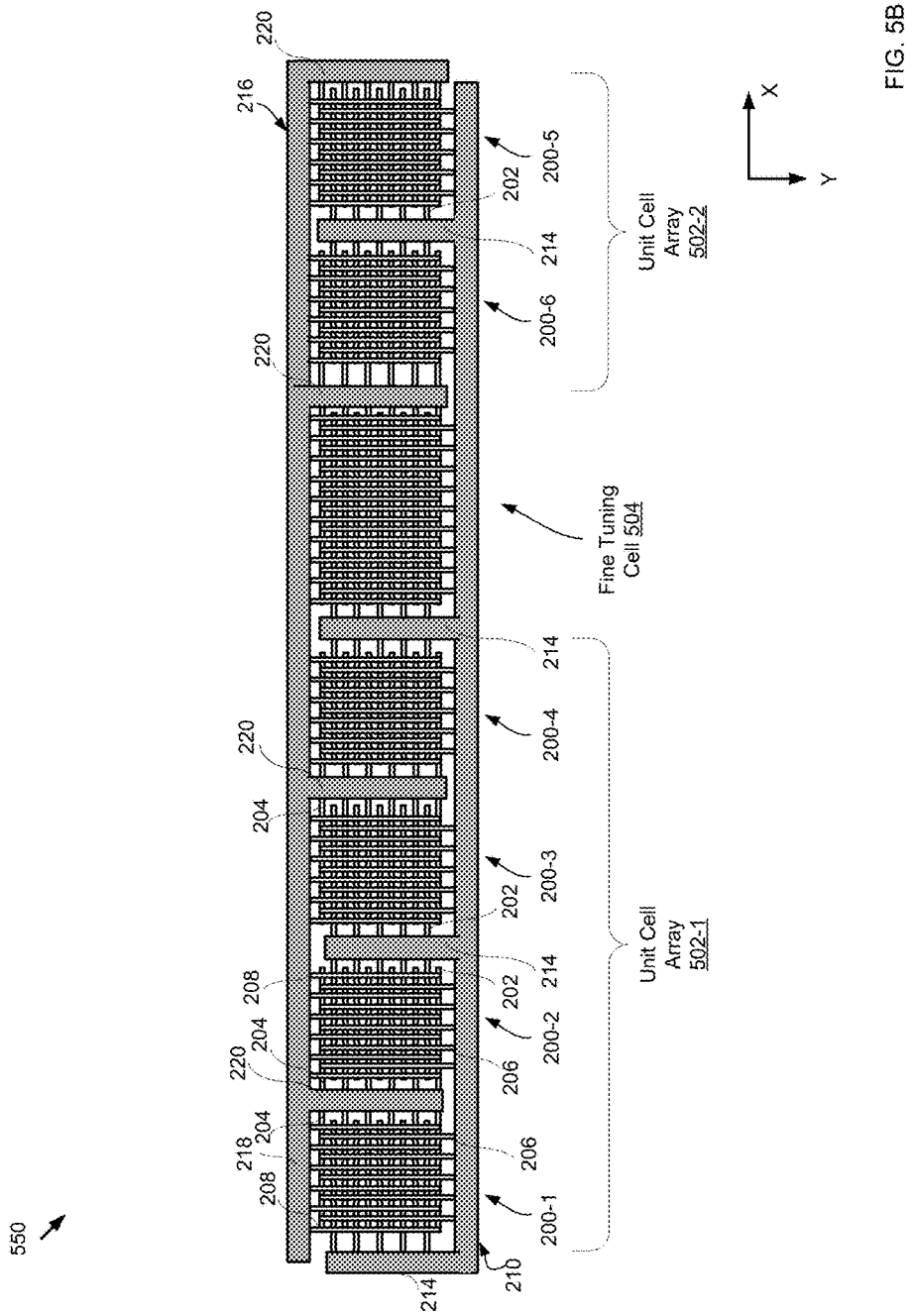
FIG. 5B is a block diagram illustrating a top view of a semiconductor device including a fingercap array and a fine tuning cell embedded within the fingercap array, according to some embodiments of the present disclosure.

As mentioned above, in some embodiments, the fine tuning cell may be located elsewhere, such as between adjacent cells of the unit cell array. With reference to FIG. 5B, illustrated therein is a fingercap array 550 including a fine tuning cell embedded within a unit cell array. In particular, the fingercap array 550 includes a first unit cell array portion 502-1, the fine tuning cell 504, and a second unit cell array portion 502-2. In the example of FIG. 5B, the first unit cell array portion 502-1 has a different number of cells than the second unit cell array portion 502-2. However, in other embodiments, the first unit cell array portion 502-1 may have the same number of cells than the second unit cell array portion 502-2.

Figure 6:
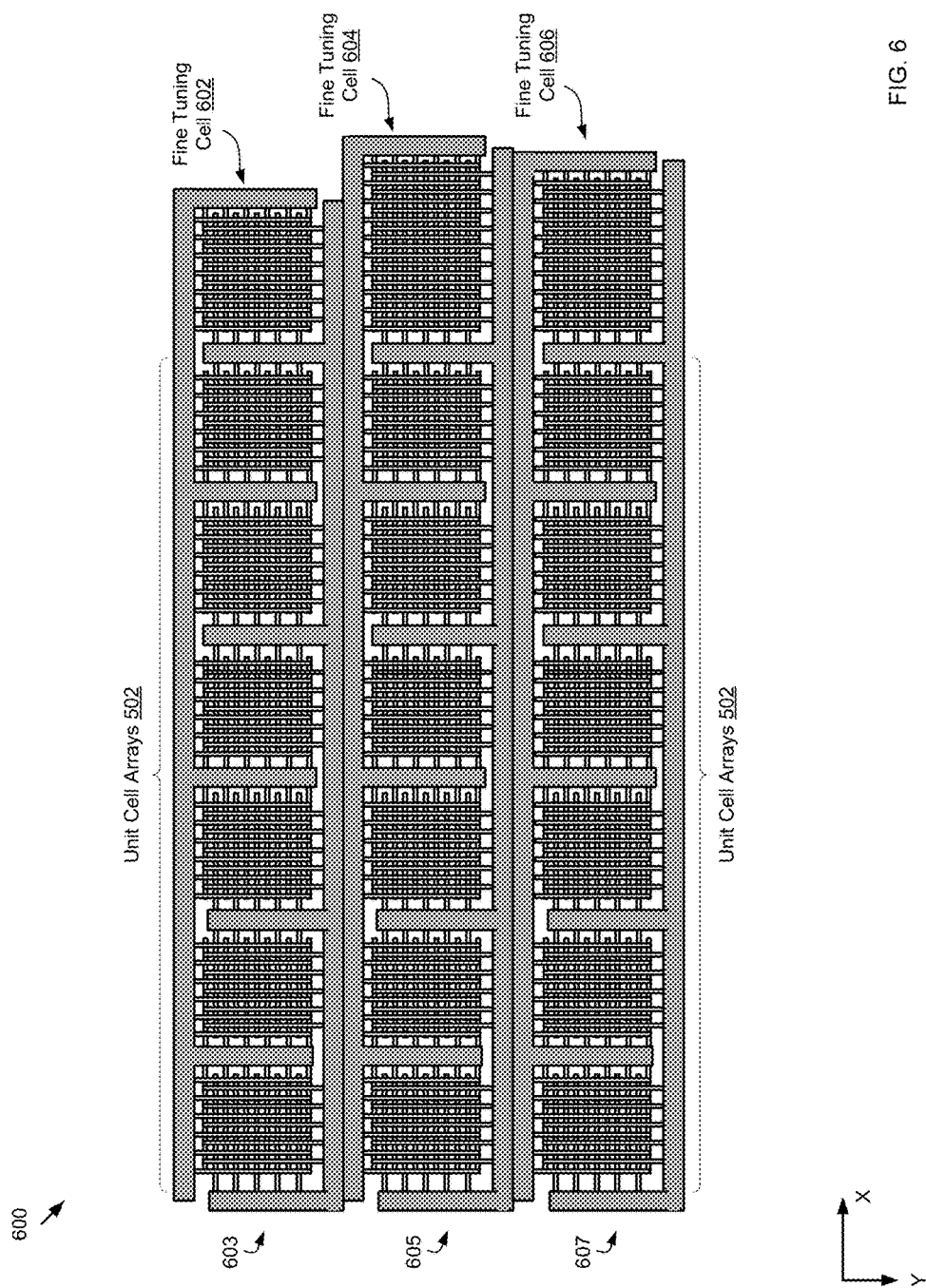
FIG. 6 is a block diagram illustrating a top view of a semiconductor device including a plurality of fingercap arrays and fine tuning cells according to some embodiments of the present disclosure.
Figure 7:
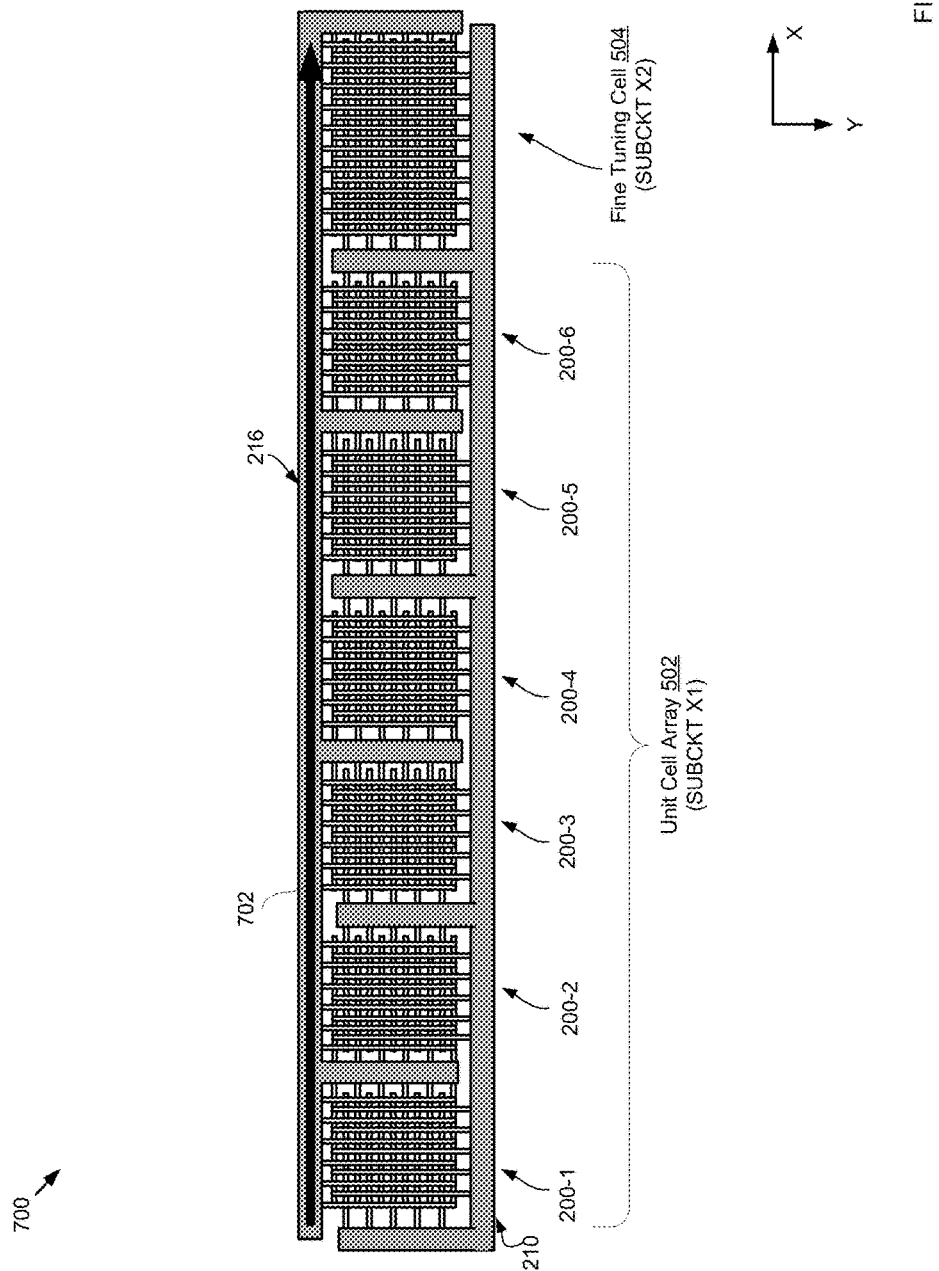
FIG. 7 is a block diagram illustrating a top view of a semiconductor device including a fingercap array and a fine tuning cell, annotated to illustrate SPICE subcircuits, according to some embodiments of the present disclosure.

With reference to FIG. 6, illustrated therein is a fingercap array 600 including a plurality of rows. As shown, the fingercap array 600 has a row 603 including the unit cell array 502 and a fine tuning cell 602, a row 605 including the unit cell array 502 and a fine tuning cell 604, and a row 607 including the unit cell array 502 and a fine tuning cell 606. By way of example, the unit cell array 502 of each of the rows 603, 605, and 607 may be substantially the same as or different than the unit cell array 502 of FIG. 5A. In some embodiments, each of the fine tuning cells 602, 604, and 606 may be the same as or different than the fine tuning cell 504 of FIGS. 5A and 5B. Additionally, in some examples, each of the fine tuning cells 602, 604, and 606 may be different from each other (e.g., having different numbers of horizontal fingers, nh). In the example of FIG. 6, the fine tuning cell 602 has thirteen horizontal fingers (nh=13), the fine tuning cell 604 has nineteen horizontal fingers (nh=19), and the fine tuning cell 606 has seventeen horizontal fingers (nh=17). However, depending on a desired target capacitance for the fingercap array 600, the fine tuning cells 602, 604, 606 may have another number of horizontal fingers. Moreover, in some embodiments, at least two of the fine tuning cells 602, 604, and 606 may be the same (e.g., having the same number of horizontal fingers, nh). Also, in some cases, one or more of the fine tuning cells 602, 604, 606 may be embedded within the unit cell arrays 502, as shown and described above with reference to FIG. 5B. In addition, while the fine tuning cells 602, 604, and 606 may have the same or different numbers of horizontal fingers (nh), the fine tuning cells 602, 604, and 606 maintain the same number of vertical fingers (nv) as each other and the same number of vertical fingers (nv) as cells of the unit cell arrays 502. By providing the option of having different fine tuning cells for each row, embodiments of the present disclosure provide added flexibility to meet design targets. In addition, while the rows 603, 605, 607 are shown as being directly adjacent to each other (e.g., where adjacent buses may connect adjacent rows), in some cases there may be a gap between adjacent rows and/or an interposing dielectric layer so as to electrically isolate the adjacent rows from each other.

As discussed above, embodiments of the present disclosure further provide a method to accurately model (e.g., using SPICE) a fingercap array including a fine tuning cell. Consider, for example, fingercap array 700 of FIG. 7 including the unit cell array 502 and the fine tuning cell 504. In the present example, the fingercap array 700 may be substantially the same as the fingercap array 500 of FIG. 5A, but the illustration of the fingercap array 700 is annotated for clarity of understanding the discussion that follows. In at least some existing methods, conventional SPICE modeling cannot accurately model fingercap arrays that include a different fine tuning cell such as the fingercap array 700. For instance, using conventional SPICE modeling and because the cells of the unit cell array 502 and the fine tuning cell 504 have a different number of horizontal fingers (nh), the unit cell array 502 may be treated as a first subcircuit (e.g., SUBCKT X1), and the fine tuning cell 504 may be treated as a second subcircuit (e.g., SUBCKT X2), where the first and second subcircuits share a common node connection. As merely one example, the first and second subcircuits may be defined in SPICE as (i) X1 n1 n2 gnd fcap_unit_cap nh=11 nv=11 multi=6, and (ii) X2 n1 n2 gnd fcap_fine_tune nh=19 nv=11 multi=1. In addition, and based at least in part on the common node connection, conventional SPICE modeling may treat the first and second subcircuits as being in parallel with each other. While treating the first and second subcircuits as being in parallel with each other may yield a correct capacitance value for the fingercap array 700, the resistance (and thus the quality factor) of the fingercap array 700 will not be correct. By way of example, an arrow 702 is provided to illustrate that current flow in the fingercap array 700 is dominated by current flowing through the buses (e.g., the bus 210 or the bus 216). Thus, for purposes of providing a correct resistance value for the fingercap array 700, the first and second subcircuits should be modeled as being in series with each other. Stated another way, the first and second subcircuits should be in parallel for accurate capacitance determination, and the first and second subcircuits should be in series for accurate resistance determination.

To overcome the shortcomings of conventional SPICE models, as discussed above, embodiments of the present disclosure provide two parameters to accurately identify the presence and design of the fine tuning cell within a SPICE model. For example, a first parameter ncol is used to identify a total number of cells in a given fingercap array (e.g., seven total cells in the example of FIG. 7), and a second parameter nh is used to identify the number of horizontal fingers for the fine tuning cell (e.g., nineteen fingers for the fine tuning cell 504). By providing these two parameters as part of the SPICE model, and with the use of appropriate mathematical equations, the parameters (e.g., ncol and nh) can be parsed in the SPICE model for accurate calculation of the resistance and capacitance of the fingercap array, as the resistance and capacitance values are a function of these two parameters (e.g., ncol and nh). By way of example, if nh is known, then the width of the fine tuning cell may also be known since the width and spacing of the individual fingers is known. This will also provide information regarding the length of the bus, which can be used to compute resistance. For instance, in some embodiments, the total capacitance of the fingercap array may be proportional to (ncol−1)*unit_cell_capacitance+fine_tuning_cell_capacitance. In addition, and in some embodiments, the total resistance of the fingercap array may be proportional to ncol. In some embodiments, the capacitance and resistance of the unit cell array 502 may initially be computed separately from the capacitance and resistance of the fine tuning cell 504, and then the total capacitance and resistance of the fingercap array 700 may be computed by treating the unit cell array 502 and the fine tuning cell 504 as being in parallel (for capacitance calculation), and as being in series (for resistance calculation). By way of example, the resistance of the unit cell array 502 may be extracted by electrical measurement of test structures having different numbers of repeating columns (ncol). In some examples, the resistance of the fine tuning cell may be extracted by electrical measurement of a set of fine tuning cell structures having different numbers of horizontal fingers (nh). In some cases, a parameter for the total number of horizontal fingers (nh_tot) in a fingercap array, discussed above with reference to FIG. 5A, may also be employed in the SPICE model. For example, by knowing both the number of horizontal fingers in a unit cell (unit_cell_nh) and the total number of horizontal fingers (nh_tot) in the fingercap array, the number of horizontal fingers in the fine tuning cell may be calculated.

Referring to FIG. 8, a method 800 for accurately modeling a fingercap array including a fine tuning cell is illustrated. The method 800 begins at block 802, where a fingercap array including a unit cell array and a fine tuning cell is designed. For example, in some embodiments, the fingercap array may be designed by a user by way of a user device including a processor and a memory storing instructions for execution by the processor. By way of example, the user device may include a laptop computer, a desktop computer, or other appropriate computing device. In some embodiments, the user device, by way of the processor, executes instructions stored in the memory to provide a circuit simulator (e.g., such as SPICE) that may be employed by the user to design the fingercap array. In some cases, the fingercap array may optionally be physically fabricated before or after the method 800, for example within an interconnect structure on a substrate, as described above, while the method 800 provides for accurate modeling of the physically fabricated fingercap array. In some embodiments, the fingercap array includes a unit cell array and a fine tuning cell such as described above with reference to FIGS. 5 and 6. Cells of the unit cell array include a fixed number of vertical fingers (nv) and a fixed number of horizontal fingers (nh), and the fine tuning cell includes the same fixed number of vertical fingers (nv) as cells from the unit cell array while also having a different number of horizontal fingers (nh). Depending on a desired target capacitance, and in some embodiments, the number of horizontal fingers (nh) for the fine tuning cell may range from the number of fingers of a single unit cell (nh=11) up to the number of fingers of approximately two unit cells (nh=21).

The method 800 then proceeds to block 804 where a first parameter (ncol) is defined that identifies a total number of cells in the fingercap array. The total number of cells may include cells both in the unit cell array and the fine tuning cell. At block 804, a second parameter (nh) is also defined that identifies a number of horizontal fingers in the fine tuning cell. In some embodiments, a parameter (nh_tot) may also be defined that identifies the total number of horizontal fingers (nh_tot) in the fingercap array, and a parameter (unit_cell_nh) may be defined that identifies the number of horizontal fingers in a unit cell. By knowing both unit_cell_nh and nh_tot, the number of horizontal fingers (nh) in the fine tuning cell may be calculated (e.g., by the user device).

The method 800 proceeds to block 806 where a total capacitance and a total resistance of the fingercap array are computed (e.g., by the user device). In some embodiments, the computation of the total capacitance and the total resistance is based at least partly on the first and second parameters (ncol and nh). In various examples, the total capacitance of fingercap array may be computed by modeling the unit cell array and the fine tuning cell as being in parallel. Further, the total resistance of the fingercap array may be computed by modeling the unit cell array and the fine tuning cell as being in series. In some embodiments, the capacitance and resistance of the unit cell array may initially be computed separately from the capacitance and resistance of the fine tuning cell, prior to computing the total capacitance and resistance, as described above.

It is noted that various configurations (e.g., the number of rows and/or columns in the fingercap array, the number of cells in each row and/or column of the finger capacitor, the number of fingers in each cell of the cell array or in each fine tuning cell) illustrated in figures are exemplary only and are not intended to be limiting beyond what is specifically recited in the claims that follow. It will be understood by those skilled in that art in possession of this disclosure that other configurations may be used.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A capacitor, comprising:
   a cell array including a plurality of cells; and
   a fine tuning cell electrically coupled to the cell array by a first bus and a second bus;
   wherein each cell of the cell array includes a first number of directionally-aligned fingers and a second number of directionally-aligned fingers;
   wherein the fine tuning cell includes a third number of directionally-aligned fingers and a fourth number of directionally-aligned fingers;
   wherein each finger of the first, second, third, and fourth number of directionally-aligned fingers is electrically coupled to one of the first and second bus;
   wherein the directional alignment of the first and second number of directionally-aligned fingers is generally perpendicular, and wherein the directional alignment of the third and fourth number of directionally-aligned fingers is generally perpendicular; and
   wherein the second number of fingers is different than the fourth number of fingers.

2. The capacitor of claim 1, wherein the cell array and the fine tuning cell are aligned in a first row along a first direction.

3. The capacitor of claim 2, wherein the first number of fingers and the third number of fingers are arrayed in a second direction generally perpendicular to the first direction, and wherein the second number of fingers and the fourth number of fingers are arrayed in the first direction.

4. The capacitor of claim 3, wherein the first bus and the second bus each include portions extending in the second direction, wherein the portions extending in the second direction interpose each cell of the cell array, and wherein the portions extending in the second direction interpose the cell array and the fine tuning cell.

5. The capacitor of claim 4, wherein the portions extending in the second direction electrically couple to the first, second, third, or fourth number of fingers.

6. The capacitor of claim 2, further comprising:
   a second row including another cell array and another fine tuning cell aligned in the second row along the first direction;
   wherein the another fine tuning cell includes a fifth number of directionally-aligned fingers and a sixth number of directionally-aligned fingers generally perpendicular to the fifth number of directionally-aligned fingers, and wherein the sixth number of fingers is different than the fourth number of fingers.

7. The capacitor of claim 1, wherein the first number of fingers, the second number of fingers, the third number of fingers, and the fourth number of fingers each include a pair of interdigitated finger sets, wherein a first set of the interdigitated finger set pair is electrically coupled to the first bus, and wherein a corresponding second set of the interdigitated finger set pair is electrically coupled to the second bus.

8. The capacitor of claim 1, wherein the first number of fingers is the same as the third number of fingers.

9. The capacitor of claim 1, wherein each cell of the cell array has a first lateral dimension along a Y-direction, and wherein the fine tuning cell has a second lateral dimension along the Y-direction equal to the first lateral dimension.

10. The capacitor of claim 1, wherein the capacitor has a total capacitance equal to a sum of capacitances of each of the cells of the cell array and the fine tuning cell.

11. An integrated circuit including a first on-chip capacitor device, the integrated circuit comprising:
a first cell array and a first fine tuning cell aligned in a first row along an X-direction, wherein the first fine tuning cell is disposed at a first end of the first cell array, and wherein cells of the first cell array and the first fine tuning cell are electrically coupled to each other by a first bus and a second bus; and
a second cell array and a second fine tuning cell aligned in a second row along the X-direction, the second row adjacent to the first row, wherein the second fine tuning cell is disposed at a second end of the second cell array, and wherein cells of the second cell array and the second fine tuning cell are electrically coupled to each other by a third bus and a fourth bus;
wherein the first fine tuning cell includes a first number of fingers extending in a Y-direction and arrayed in the X-direction, wherein each finger of the first number of fingers is electrically coupled to one of the first and second bus;
wherein the second fine tuning cell includes a second number of fingers extending in the Y-direction and arrayed in the X-direction, wherein each finger of the second number of fingers is electrically coupled to one of the third and fourth bus; and
wherein the first number of fingers is different than the second number of fingers.

12. The integrated circuit of claim 11, further comprising:
a programmable logic device (PLD) including the first on-chip capacitor device;
wherein the first on-chip capacitor device provides one of plural tuned capacitances selectable on the PLD.

13. The integrated circuit of claim 11,
wherein cells of the first cell array each include a third number of fingers extending in the Y-direction and arrayed in the X-direction, and wherein each finger of the third number of fingers is electrically coupled to one of the first and second bus;
wherein cells of the second cell array each include a fourth number of fingers extending in the Y-direction and arrayed in the X-direction, and wherein each finger of the fourth number of fingers is electrically coupled to one of the third and fourth bus; and
wherein the third number of fingers is different than the first number of fingers, and wherein the fourth number of fingers is different than the second number of fingers.

14. The integrated circuit of claim 11,
wherein cells of the first cell array each include a third number of fingers extending in the X-direction and arrayed in the Y-direction, and wherein each finger of the third number of fingers is electrically coupled to one of the first and second bus; and
wherein cells of the second cell array each include a fourth number of fingers extending in the X-direction and arrayed in the Y-direction, and wherein each finger of the fourth number of fingers is electrically coupled to one of the third and fourth bus.

15. The integrated circuit of claim 14,
wherein the first fine tuning cell includes a fifth number of fingers extending in the X-direction and arrayed in the Y-direction, wherein each finger of the fifth number of fingers is electrically coupled to one of the first and second bus;
wherein the second fine tuning cell includes a sixth number of fingers extending in the X-direction and arrayed in the Y-direction, wherein each finger of the sixth number of fingers is electrically coupled to one of the third and fourth bus.

16. The integrated circuit of claim 15, wherein the third number of fingers is the same as the fifth number of fingers, and wherein the fourth number of fingers is the same as the sixth number of fingers.

17. The integrated circuit of claim 11, wherein each cell of the first cell array has a first lateral dimension along the Y-direction, wherein the first fine tuning cell has a second lateral dimension along the Y-direction equal to the first lateral dimension, wherein each cell of the second cell array has a third lateral dimension along the Y-direction, wherein the second fine tuning cell has a fourth lateral dimension along the Y-direction equal to the third lateral dimension.

18. The integrated circuit of claim 11, wherein the first fine tuning cell has a first cell width, and wherein the second fine tuning cell has a second cell width different than the first cell width.

19. A method, comprising:
providing a fingercap array including a cell array and a fine tuning cell, wherein cells of the cell array include a fixed number of vertical fingers and a fixed number of horizontal fingers, and wherein the fine tuning cell includes the fixed number of vertical fingers and a different number of horizontal fingers;
defining a first parameter that identifies a total number of cells in the fingercap array and a second parameter that identifies the different number of horizontal fingers; and
computationally determining, based in part on the first parameter and the second parameter, a total capacitance and a total resistance of the fingercap array, wherein the total capacitance is computationally determined by treating the cell array and the fine tuning cell as being in parallel, and wherein the total resistance is computationally determined by treating the cell array and the fine tuning cell as being in series.

20. The method of claim 19, wherein the different number of horizontal fingers is determined based on both a total number of horizontal fingers in the fingercap array and on a number of horizontal fingers in each cell of the cell array.

* * * * *